(12) United States Patent
Stiver et al.

(10) Patent No.: US 8,223,025 B2
(45) Date of Patent: Jul. 17, 2012

(54) DATA CENTER THERMAL MONITORING

(75) Inventors: David W. Stiver, Santa Clara, CA (US);
Shawn Lewis, San Francisco, CA (US);
Gregory P. Imwalle, Sunnyvale, CA (US)

(73) Assignee: Exaflop LLC, Mountain View, CA (US)

( * ) Notice: Subject to any disclaimer, the term of this patent is extended or adjusted under 35 U.S.C. 154(b) by 281 days.

(21) Appl. No.: 12/493,107

(22) Filed: Jun. 26, 2009

(65) Prior Publication Data

US 2010/0085196 A1    Apr. 8, 2010

Related U.S. Application Data

(60) Provisional application No. 61/076,104, filed on Jun. 26, 2008.

(51) Int. Cl.
*G08B 17/00* (2006.01)
*F25D 1/00* (2006.01)
*H05K 7/20* (2006.01)

(52) U.S. Cl. .......... 340/584; 340/506; 361/696; 62/199; 62/229

(58) Field of Classification Search ............... 340/584, 340/506, 511; 361/683, 687, 715, 696; 62/198, 62/199, 229; 374/1, 144; 61/199, 229, 198
See application file for complete search history.

(56) References Cited

U.S. PATENT DOCUMENTS

| | | | |
|---|---|---|---|
| 6,338,150 B1 | 1/2002 | Johnson et al. | |
| 6,786,056 B2 * | 9/2004 | Bash et al. | 62/199 |
| 6,873,883 B2 * | 3/2005 | Ziarnik | 700/300 |
| 6,938,433 B2 * | 9/2005 | Bash et al. | 62/229 |
| 7,002,479 B1 * | 2/2006 | Huang et al. | 340/584 |
| 7,360,122 B2 | 4/2008 | Srivastava et al. | |
| 7,429,128 B2 * | 9/2008 | Izumiura et al. | 374/144 |
| 2004/0024571 A1 | 2/2004 | Trinon et al. | |
| 2005/0021306 A1 | 1/2005 | Garcea et al. | |
| 2005/0228618 A1 | 10/2005 | Patel et al. | |
| 2005/0289376 A1 | 12/2005 | Hartman et al. | |
| 2006/0168975 A1 | 8/2006 | Malone et al. | |
| 2007/0032908 A1 | 2/2007 | Hyland et al. | |
| 2007/0089446 A1 | 4/2007 | Larson et al. | |
| 2008/0046766 A1 | 2/2008 | Chieu et al. | |

FOREIGN PATENT DOCUMENTS

WO     WO 01/93037     12/2001

OTHER PUBLICATIONS

International Search Report and Written Opinion dated Jan. 14, 2010 issued in equivalent PCT Application No. PCT/US2009/048966, 11 pages.
International Preliminary Report on Patentability dated Jan. 5, 2011 issued in related PCT Application No. PCT/US2009/048966, 6 pages.
Extended European Search Report mailed Jan. 5, 2012 in corresponding EP application No. 09771214.5 (9 pages).

* cited by examiner

*Primary Examiner* — Van T. Trieu
(74) *Attorney, Agent, or Firm* — Fish & Richardson P.C.

(57) ABSTRACT

A measurement indicative of a temperature of a computer is received and a thermal health value for the computer is calculated based on the measurement.

41 Claims, 3 Drawing Sheets

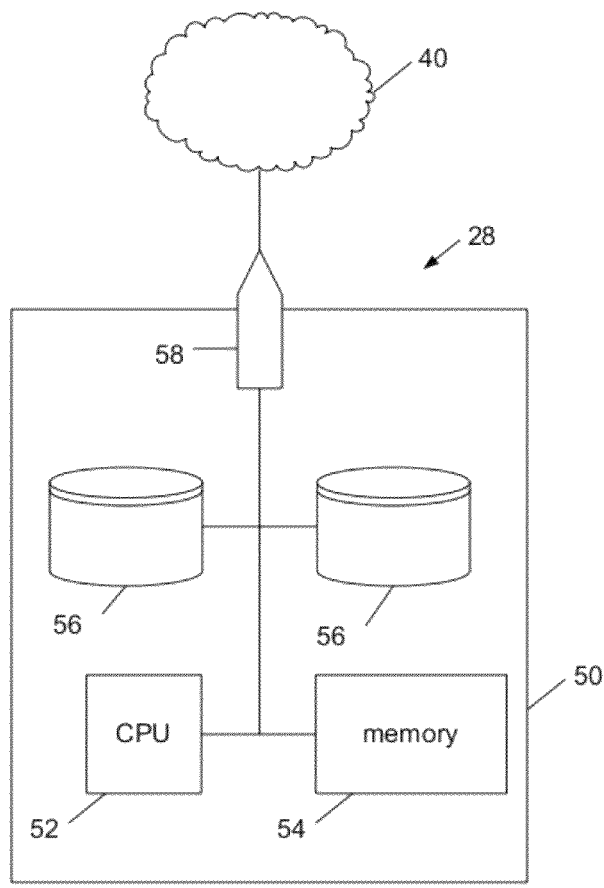
FIG. 1C
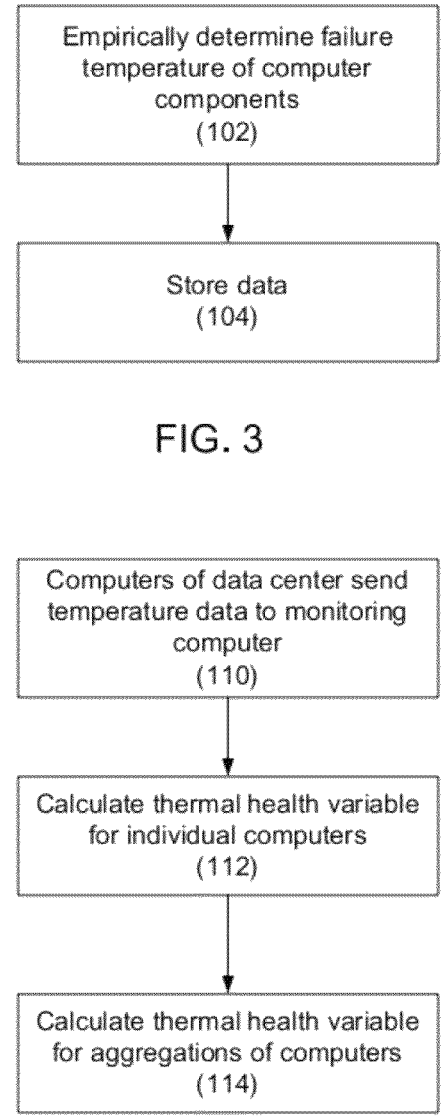
FIG. 3
FIG. 4

DATA CENTER THERMAL MONITORING

CROSS-REFERENCE TO RELATED APPLICATIONS

This application claims priority to U.S. application Ser. No. 61/076,104, filed on Jun. 26, 2008.

TECHNICAL FIELD

This document relates to thermal monitoring of computers.

BACKGROUND

The power consumed by a microprocessor is transformed into heat. A pair of microprocessors mounted on a single motherboard can draw 200-400 watts or more of power. If that power draw is multiplied by several thousand (or tens of thousands) to account for the computers in a data center, the potential for heat generation can be appreciated. Not only must a data center operator pay for electricity to operate the computers, it must also pay to cool the computers. The cost of removing heat may be a major cost of operating large data centers.

In addition, components of a computer, such as a microprocessor, memory or disk drive, are subject to breakdown when subjected to high temperatures. A fan can provide a steady flow of air across the components of the computer to carry away heat, and heat sinks can be attached to some components, particularly the microprocessor, to improve thermal transfer to the surrounding air. Despite these precautions, computer components can still overheat and fail, particularly when operating at high utilization.

SUMMARY

In one aspect, a method includes receiving a measurement indicative of a temperature of a computer and calculating a thermal health value for the computer based on the measurement.

Implementations of the invention can include one or more of the following features. Calculating the thermal health value may include comparing the measurement to stored thresholds. The measurement may be one or more of a temperature, a power draw of the computer, a utilization of the computer, or a rotation rate of a fan of the computer. Multiple measurements of different types may be received, and calculating the thermal health value may combines the multiple measurements. The measurement may be a temperature measurement of one or more of a central processing unit of the computer, a disk drive of the computer, a memory module of the computer, a motherboard of the computer, or air in proximity to the computer. The thermal health value may be a dimensionless value, e.g., a number, e.g., in the range of 0 to 1 or in the range of 0 to 10. A descriptor may be selected for the thermal health value from a finite set of descriptors. Calculating the thermal health value may include normalizing for a platform type of the computer. An alarm may be generated if the thermal health value crosses a threshold. One or more of power, cooling and utilization may be adjusted based on the thermal health value. A measurement indicative of the temperature of the computer may be received from each of a plurality of computers, and a thermal health value may be calculated for each of a plurality of computers. At least some of the plurality of computers may be different platforms, and calculating a thermal health value for each of a plurality of computers may include normalizing such that each thermal health value falls within the same range of values. The range of values may map to computer behavior that is uniform across different platforms. The thermal health values may be aggregated, e.g., the thermal health values of the plurality of computers may be averaged to generate a thermal health value for the plurality of computers. The thermal health values may be aggregated across one or more of a power domain, a cooling domain, a logical domain and a physical location domain.

In another aspect, a computer program product, tangibly embodied in a machine readable storage media, comprising instructions for causing a processor to perform these methods.

Advantages can include one or more of the following. An operator can easily evaluate the thermal health of computers in a data center at different aggregation levels. The thermal health value can be monitored over time, and past behavior can be used to predict future thermal health. Corrective action can be taken if the thermal health variable indicates that the computers are at risk of failure, thereby improving reliability and reducing down-time of data center.

The details of one or more embodiments are set forth in the accompanying drawings and the description below. Other features, objects, and advantages will be apparent from the description and drawings, and from the claims.

DESCRIPTION OF DRAWINGS

FIG. 1C is a schematic view of the components of a computer in the data center.

FIG. 3 is flowchart illustrating a method of collecting data on failure temperatures for computer components.

FIG. 4 is flowchart illustrating a method of thermally monitoring a data power center.

DETAILED DESCRIPTION

Large-scale Internet services and the massively parallel computing infrastructure that is required to support them can require the design of warehouse-sized computing systems, e.g., data center facilities, made up of thousands or tens of thousands of computing nodes, their associated storage hierarchy and interconnection infrastructure. The data center can include many different types of computer equipment, e.g., different types of computers, and each piece of equipment is typically constructed from multiple smaller electronic components.

As note above, computer components generate heat. Thermal events, e.g., situations in which the temperature of the computer components rises sufficiently high to cause short-term performance impairment or reduce long-term reliability, can be caused by a variety of factors, such as cooling plant failures, deployment of too many computers in close proximity (so that the local heat generated is greater than the local cooling capabilities of the cooling system), excessive utilization, and season variations.

Different computers can have different sensitivities to high temperatures, e.g., the temperature at which components fail, suffer impaired performance or long-term reliability loss, and the nature of the failure, vary for platforms of differing configuration. Moreover, only specialists are likely to understand the danger to a computer represented by raw temperature measurements. To make temperature data more useful to a non-specialist operator, e.g., for real time human decision-making or formation of pre-programmed responses, temperature data for a computer or group of computers can be transformed into a thermal health value.

Although a thermal health value can be generated for a single machine, thermal health is particularly useful for evaluating a large number of machines, e.g., an entire cluster.

The thermal health value can indicate a margin, e.g., how "close" the computer or group of computers is to impaired performance. The overall thermal health of a data center can be governed by a distribution, rather than a single worst case or maximum value.

An exemplary data center facility will be described as an introduction to the thermal monitoring issues.

Figure 1A:
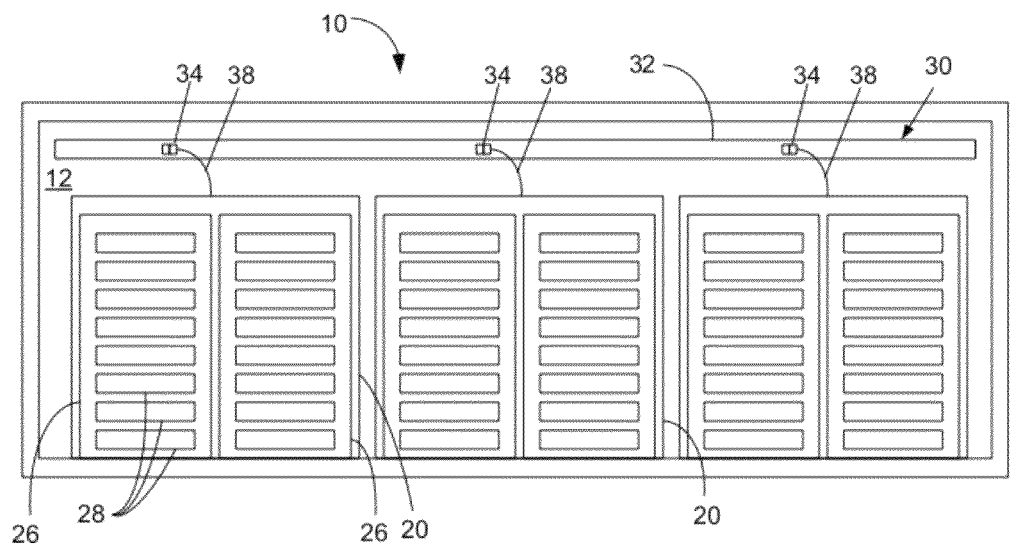
FIGS. 1A and 1B are sectional side and plan views, respectively, of a facility operating as a data center.
Figure 1B:
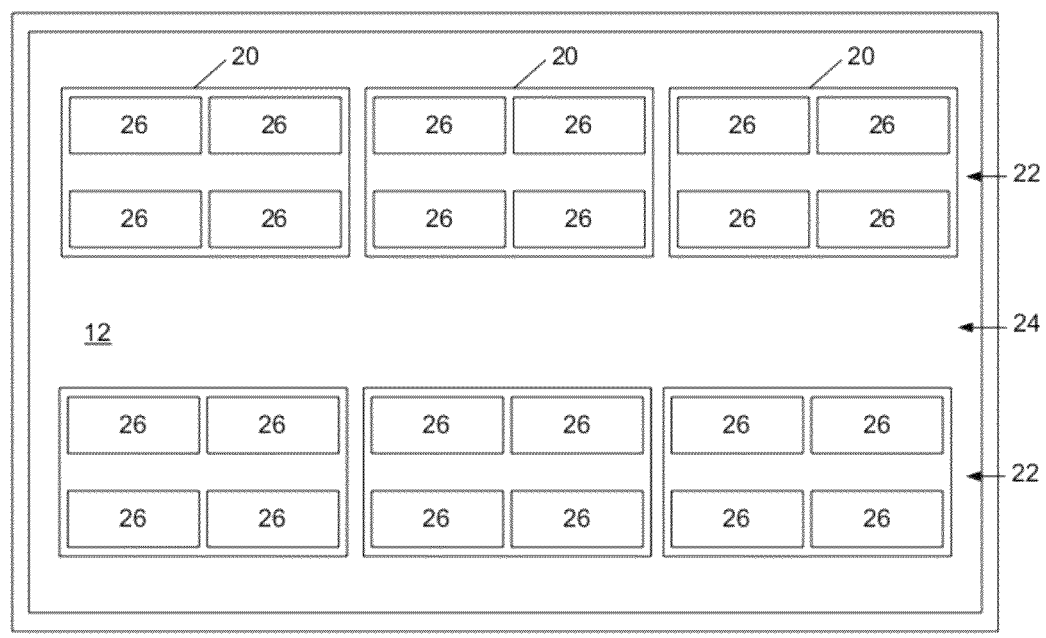

FIGS. 1A and 1B are side and plan views to illustrate an exemplary facility 10 that serves as a data center. The facility 10 includes an enclosed space 12 and can occupy essentially an entire building, or be one or more rooms within a building. The enclosed space 12 is sufficiently large for installation of numerous (dozens or hundreds or thousands of) racks of computer equipment, and thus could house hundreds, thousands or tens of thousands of computers.

Modules, e.g., cages 20, of rack-mounted computers are arranged in the space in rows 22 separated by access aisles 24. Each cage 20 can include multiple racks 26, e.g., four to eight racks, and each rack includes multiple computers 28, e.g., trays.

FIG. 1C is a schematic view of a computer from a rack. In general, each computer 28 can include a circuit board 50, such as a motherboard, on which a variety of computer-related components are mounted, such as a central processing unit (CPU) 52, memory 54, one or more disk drives 56, and an input/output port 58 to connect the computer to the network of other computers in the data center.

Returning to FIGS. 1A and 1B, the facility also includes a cooling system to remove heat from the data center via one more heat exchange processes, e.g., an air conditioning system to blow cold air through the room, or cooling coils that carry a liquid coolant past the racks, and a data grid 40 (see FIG. 1C) for connection to the rack-mounted computers to carry data between the computers and an external network, e.g., the Internet.

As mentioned above, components of a computer, such as a microprocessor, memory or disk drive, can fail when subject to high temperatures. Failure of a component typically includes multiple modes, such as a first temperature zone where the performance of the component is altered (generally reduced), a higher second temperature zone in which the error rate of the component, e.g., read/write errors for a disk drive, dramatically increases, and a still higher third temperature zone in which the component completely fails. The temperatures at which components exhibit the different modes of failure can be characterized independently through empirical means. However, there can be other considerations which can impact performance, including component duty cycle, voltage, and manufacturing variation.

The order in which components fail as a function of temperature can be similar or vary across different platforms, e.g., for some platforms, as temperature increases the memory can fail first, followed by the disk drive, followed by the CPU. Other orders are possible. For example, on some platforms, the CPU performance may be most susceptible to temperature excursions, followed by disk drives and then memory. However, the exact temperature as which failures occur vary for platforms of differing configuration. For example, different models of CPUs will begin failing at different temperatures. Thus, even if temperature data is available, the temperature data itself does not necessarily provide useful information regarding the thermal health of the machine, much less a collection of machines having different configurations such as typically occurs in a data center.

Thus, as stated above, it would be useful to the human operator of a data center to have an indication of the thermal condition of a computer, or group of computers, that does not require knowledge of the particular platform to evaluate whether the computer is failing or is in danger of failure. Failure can include either reduced performance, or irreparable damage, or both, and different types of failure can receive different weightings in determining the thermal health.

The fact that components tend to proceed through the same order of failure modes as temperature increases tends to result in a certain sequence of error modes as temperature increases. Thus, as temperatures increase, the computer will tend to proceed through several zones of thermal "health", e.g., at lower temperatures the computer will operate normally and can be considered "healthy", at higher temperatures certain errors will occur and the computer could be considered "unhealthy", and once the computer fails entirely it could be considered "dead". In addition, the "unhealthy" stage could include several levels as the errors become more frequent or errors begin occurring in a larger number of components. In addition, there can be a "danger" stage indicating that if temperatures increase further that the computer will enter the "unhealthy" stage, and at even higher temperature a "critical" stage indicating that the computer is on the verge of complete failure. There could be nearly any number of unique health-level stages defined.

This general indication of the thermal condition of the computer can be termed a "thermal health variable", which can have a "thermal health value". Thus, the thermal health variable is a metric, typically a non-dimensional metric, of the thermal condition of a single computer or aggregation of computers in the data center, but which is independent of the particular configuration of the computer.

The thermal health variable can be normalized across computers of different configuration. That is, the thermal health value is calculated for the individual computer to fall within a scale shared across multiple computers, e.g., across all computers of a data center, with at least the endpoints of the shared scale (and potentially at least some middle points in the scale) representing similar behavior of the computers. Such a thermal health value can be calculated from the combination of contemporary measurements indicative of the machine temperature, and historical empirical measurements of temperatures at which the behavior occurs. Because data centers are a heterogenous collection of equipment, normalization across these differences helps provide a usable parameter for assessing the thermal health of the entire cluster. Essentially, the thermal health variable should represent the health of the computer or group of computers, but be independent of the individual machine specifics.

In some cases, a system is only as healthy as its most unhealthy component. For example, if a CPU is "dead" then the entire computer will be dead. In some cases, the thermal health is an aggregation of component thermal healths. For example, thermal health at the datacenter level is an aggregation of thermal healths for individual machines. In some implementations, the thermal healths can be aggregated to provide the thermal health of the aggregation of computers simply by averaging together the thermal health of the individual computers in the aggregation.

Figure 2:
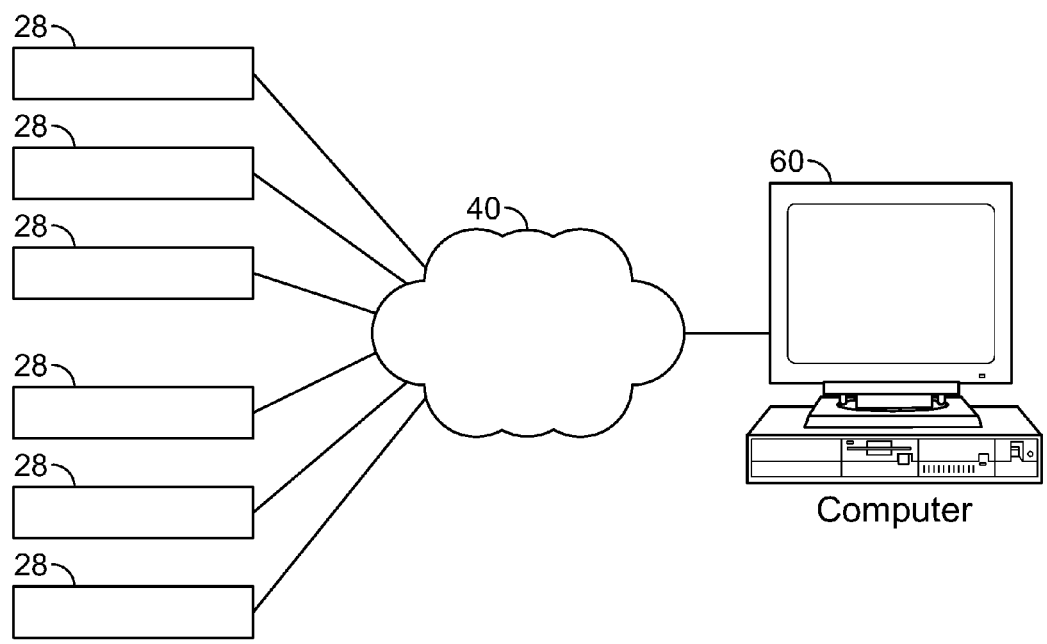
FIG. 2 is a schematic illustration of computers of a data center configured to provide temperature information to a monitoring computer.

FIG. 2 is a schematic diagram of a system for determining a thermal health value. At least some of the computers 28 in the data center are connected through a network, e.g., the data grid 40, to a monitoring computer 60, such as a general purpose computer, e.g., a workstation.

These computers 28 each include at least one sensor that measures a temperature of at least one of the components. For example, the computers 28 can use sensors to measure the temperature of the CPU, memory, hard drive or motherboard. In addition, the computers 28 can accumulate other data indicative of the thermal health, such as fan speed, which would indicate how hard a machine is working to cool itself. For instance, if two machines are at the same temperature, but the fan speed of the first machine is at the maximum possible value, while the fan speed of the second machine two is at a nominal value, the thermal health for the first machine would be reported as being slightly worse because this machine has less ability to maintain its thermal health in adverse conditions. In addition, there can be sensors installed in the racks or cages to measure the temperature of the environment, e.g., the air near the computers 28, and this data can used in the determination of thermal health. In addition, the computers can gather data regarding their power draw and/or utilitization, as temperature can be assumed to scale with power and utilization. The computer 28 can receive thermal data from other tray-level thermal sensors, and from other rack or cage-level sensors, e.g., sensors that monitor the cooling infrastructure for a rack or cage, e.g., that measure the entering air temperature (EAT), leaving air temperature (LAT), entering water temperature (EWT) and leaving water temperature (LWT).

In some implementations, each computer calculates its own thermal health based on the specifics of its individual components and available data from sensors. In some implementations, some or all computers send their measurements to a monitoring computer 60, and the monitoring computer 60 calculates the thermal health based on the received data. The monitoring computer 60 can receive thermal data from other tray-level thermal sensors, and from other sources of hardware health information. In some implementations, the thermal health values calculated by the computers 28 are sent to the monitoring computer 60, and the monitoring computer can calculate thermal health for aggregations of the computers 28.

FIG. 3 is a flowchart illustrating a method of determining failure temperatures of a computer. Initially, the response of one or more computers to temperature, including the failure temperature of computer components, is determined empirically (step 102). For example, a test computer with known components can be placed in a temperature controlled environment, e.g., an oven. The test computer is operated while the temperature of the environment is increased. The performance of the test computer is monitored, e.g., the test computer can run test routines and report errors, while thermocouples or other sensors can measure the temperatures of the components. From this data, the temperatures at which the components fail can be determined. The data indicating the components and their failure temperatures can be stored in a database (step 104).

For each type of platform, a function can be generated to relate the sensor measurements available for that platform to the thermal health value. These functions can also be stored in a database that relates the platforms to the functions. A computer installed in the data center can be configured (before or after installation) to include the function that corresponds to its platform. The initial decision on what constitutes a "failure" on a particular component or computer so as to set an associated threshold can involve some judgment by a designer of the thermal health monitoring system, but so long the mapping is consistent that one side of the range for the thermal health value represent good performance and the other side represents near total failure, the thermal health variable should provide useful information. In addition, it can be possible to provide a somewhat consistent standard for similar components so that if different platforms have the same thermal health value, then they are experiencing the same performance degradation. For example, a certain error rate (e.g., in terms of errors/second), for a particular type of component, e.g., for memory, could be selected by the designer to consistently map to a certain thermal health value, e.g., a threshold between the different desired descriptors, e.g., "healthy" and "unhealthy".

FIG. 4 is a flowchart illustrating a method of determining a thermal health value during operation of a data center. Some or all of the computers send data indicating the temperature of their components to the monitoring computer (step 110). For each computer, the monitoring computer calculates a thermal health variable based on the received temperature data and the previously measured failure temperatures for the component in the computer (step 112). In some implementations, the computer stores the function and calculates its own thermal health based on the specifics of its individual components and available sensors, and then sends the calculated thermal health to a monitoring computer.

The thermal health variable can be calculated from data from a variety of sensors on each computer, including temperature sensors, fan speed, power, and utilization. In order to allow comparisons across different types of platforms, the thermal health variable is normalized to indicate similar machine behaviors at similar thermal health values. For example, at the lowest thermal health value, e.g., 0, all of the machines would fall into the category of having a substantial margin to increase temperature without risk, whereas at the highest thermal health value, e.g., 10, all of the machines would fall into the category of permanent damage. As indicated earlier, the machine behaviors are correlated back to previously measured failure temperatures (step 112).

The calculated thermal health variable can be a non-dimensional metric, e.g., a number. In some implementations, the thermal health variable has a finite small number of possible values. For example, the thermal health variable could be an integer ranging from 0 to 10 or 1 to 5, e.g., with lower numbers indicating better health. In some implementations, the thermal health variable can be a number with a vary large number of possible values, e.g., represented by a word of data in the computer; in such implementations the thermal health value can be real number, e.g., ranging from 0 to 1 or 0 to 10.

The thermal health variable can be displayed to the operator. In some implementations, the thermal health variable can be displayed with an associated text description, e.g., "good", "Ok" or "bad". Other descriptors can include "substantial margin", "normal operating condition", "exceeds normal operating condition", "reduced performance", "increased error rate", and "permanent failure." In some implementations, the numerical value is not displayed and only the text description is displayed.

Where the thermal health variable has a finite small number of possible values, the textual descriptions could be mapped on a one-to-one basis with the values, or the thermal health value could itself be textual description (rather than a number). Where the thermal health variable can be effectively continuous, various ranges of values can be associated with the textual descriptors. For example, if the thermal health variable scales between 0 and 1, then values from 0 to 0.75 can indicate the machine is operating within expected temperature range, values from 0.75 to 0.9 can indicate that the machine is operating outside expected controllable temperature range, values from 0.9 to 1 can indicate that the machine may have reached throttling or maximum allowable temperature, and a value of 1 indicates that the machine has reached the maximum allowable temperature.

In general, to calculate the thermal health variable, the received temperature data can be fed into a function in which the previously measured failure temperatures of the test computers determine thresholds. The received temperatures are compared to the thresholds to determine the thermal health variable. For example, exceeding any of a first set of thresholds might set the thermal variable as "ok", whereas exceeding any of a second set of thresholds might set the thermal variable as "bad". The function can be fairly complicated, including calculation of a value from differences between the temperature measurements and the thresholds and weighting of the differences based on the types of component or threshold.

In addition to the constants in the function (e.g., the empirically measured thresholds) varying from machine to machine depending on the tolerances of the components of the particular machines, the variables used in the function (e.g., the type of measurement, such as temperature or utilization), and the relationship of the variables in the function, can vary from machine to machine, so long as the calculated value falls within a scale shared across multiple computers. For example, some computers might use temperature measurements to calculate the thermal health value, and other computers might use utilization to calculate the thermal health value. So long as the values use a shared scale, they can be aggregated, e.g., simply averaged, to determine the thermal health of the aggregate of computers. In some implementations, some computers are weighted more heavily than other computers the thermal health of the aggregate of computers.

In some implementations, the thermal health value is a numerical value calculated from other numerical measurements and empirically measured thresholds of behavior. In one example, an algorithm to derive a normalized non-dimensional thermal health value between 0 and 1, with 0 indicating the maximum possible margin and 1 indicating that the machine is at or above the highest/worst behavioral zone is the following:

$$THV = 1 - [T_{allowable} - T]/M_{max}$$

where THV is the thermal health value, $T_{allowable}$ is the maximum allowable temperature before highest/worst behavioral changes, T is the reported temperature from a sensor, and $M_{max}$ is the maximum allowable expected margin, used to normalize results between 0 and 1.

The monitoring computer will communicate with the individual computers throughout the data center. Optionally, the monitoring computer can aggregate thermal health data for further processing, e.g., the monitoring computer optionally can calculate thermal health variables for one or more aggregations of computers (step 114). The thermal health value of the aggregation can be calculated as the average of the thermal health variables of the individual computers in the aggregation, although other techniques such as cumulative distribution functions or mean-square may be applicable.

The aggregation can be a location-based aggregation, i.e., based on physical location of the computers. For example, the thermal health value could be determined for a group of computers within a given rack, module, row, cluster or data center.

The aggregation can be an infrastructure-based aggregation, i.e., based on computers that share a common infrastructure component. For example, the thermal health value could be determined for a group of computers within a particular power or cooling domain.

The aggregation can be a service-based aggregation, i.e., based on function that the computers perform in the data center, or even based on the customer that the computers serve. For example, the thermal health value could be determined for a group of computers in the data center that serve search results, electronic mail or map generation. The aggregation can be a logical network grouping, e.g., based on computers within a particular networking domain or subdomain.

It can be useful to present the thermal health of an aggregation as a cumulative distribution function, i.e., the percentage of computers operating at or below a given thermal health value.

Once the thermal health variable has been determined, it can be used, e.g., automatically by control software, to adjust the performance of the computers to avoid thermal failure. For example, if the thermal health variable exceeds a certain threshold or indicates a warning, then the computers in an aggregation can be throttled, e.g., by redirecting queries to other computers so as to reduce utilization of the computers in the aggregation and thus reduce power use and temperature. As another example, the thermal health variable can be used to control the cooling system or other cooling resources, e.g., if the thermal health value exceeds a certain threshold then the rate of heat removal can be increased to lower the temperature of the computers and reduce the risk of failure. Conversely, if the thermal health value is below a certain threshold, this can indicate that the computers have some margin to operate at higher temperature, and the rate of heat removal can be decreased to reduce cooling costs. In extreme situations, one or more computers that exceed a critical threshold can be automatically shut down to avoid permanent damage to the computer components.

The monitoring computer can automatically generate an alarm to alert the data center operator if a thermal health variable crosses a threshold, e.g., exceeds some preset value. For example, a rack-level thermal health value can be generated as the average thermal health value of all computer in a given rack. As an example of an alarm condition, an alarm can be generated if a preset percentage, e.g., 4% to 10%, of the racks in the cluster have a thermal health value that exceeds a preset value, e.g., 0.75 on a 0-to-1 scale. The function can include a safety margin so that if some temperatures are close to a threshold, the thermal health variable will indicate a warning.

The thermal health variable can also be used to make decisions regarding machine placement. For example, by comparing the thermal health values aggregated at the rack level, an operator can determine which racks have greater capacity to handle additional thermal loads (e.g., under the presumption that racks with the lowest thermal health values are best able to handle additional thermal loads). Placement of new machines into the racks with the greater capacity to handle additional thermal loads can then be prioritized.

The relative weighting of the classes of failures (e.g., reduced performance versus irreparable damage) could be set for or by the customer, since some customers may consider one type of failure to be worse than another.

A thermal rate of change, e.g., the time derivative of the thermal variable, can be calculated for a computer or aggregation of computers. A high rate of change can indicate that a machine or group of machines may be in trouble. This thermal rate of change can be normalized as discussed above for the thermal health variable.

The thermal health value may be calculated even if no empirical measurements have been conducted on the particular platform. Assuming that the characteristics of the platform are stored, e.g., the type of CPU, memory and number and type of disk drives, and assuming that empirical measurements have been conducted on similar equipment, e.g., the same or similar components, it may be possible to calculate approximate failure temperatures. For example, failure temperatures could be interpolated from the measured failure temperatures of the other test components, e.g., test components from the same manufacturer.

Various steps of the processes discussed above, particularly the calculation of the thermal health value, are performed by computer. Some steps, such as shutting down computers in response to elevated danger levels of the thermal health variable, could be performed by human operators in response to receiving the thermal health variable, e.g., when displayed, or automatically by control software, e.g., in the monitoring computer.

An advantage of machine thermal health is that normalized values are generated therefore the operator, or a programmer designing control software that uses thermal health variable, does not have to know about platform type. The thermal health can be aggregated across many different dimensions, and many different statistical methods can be applied to gather information about the health of the computers. In addition to computers, the thermal health variable may be applicable to other forms of computing equipment that might fail as a result of high temperatures, such as network switches, smart racks or power units.

Embodiments and all of the functional operations described in this specification can be implemented in digital electronic circuitry, or in computer software, firmware, or hardware, including the structural means disclosed in this specification and structural equivalents thereof, or in combinations of them. Embodiments of the invention can be implemented as one or more computer program products, i.e., one or more computer programs tangibly embodied in an information carrier, e.g., in a machine readable storage media, such as a memory or disk, or in a propagated signal, for execution by, or to control the operation of, data processing apparatus, e.g., a programmable processor, a computer, or multiple processors or computers.

A number of embodiments of the invention have been described. Nevertheless, it will be understood that various modifications may be made without departing from the spirit and scope of the invention. Accordingly, other embodiments are within the scope of the following claims.

What is claimed is:

1. A computer-implemented method, comprising:
    receiving, with a central electronic monitoring system and through a communication network, a plurality of measurements that are each indicative of a temperature of a particular computer of a plurality of computers; and
    calculating a thermal health value for each of the plurality of computers based on the measurement,
    wherein calculating the thermal health value includes normalizing for a platform type of the particular computer.

2. The method of claim 1, wherein calculating the thermal health value includes comparing the measurement to a stored threshold.

3. The method of claim 1, wherein the measurement comprises one or more of a temperature, a power draw of the computer, a utilization of the computer, or a rotation rate of a fan of the computer.

4. The method of claim 3, further comprising receiving multiple measurements of different types and wherein calculating the thermal health value combines the multiple measurements.

5. The method of claim 1, wherein the measurement comprises a temperature measurement of one or more of a central processing unit of the computer, a disk drive of the computer, a memory module of the computer, a motherboard of the computer, or air in proximity to the computer.

6. The method of claim 1, wherein the thermal health value is a dimensionless value.

7. The method of claim 6, wherein the thermal health value is a number in the range of 0 to 1.

8. The method of claim 6, wherein the thermal health value is a number in the range of 0 to 10.

9. The method of claim 1, further comprising selecting a descriptor for the thermal health value from a finite set of descriptors.

10. The method of claim 1, further comprising generating an alarm if the thermal health value crosses a threshold.

11. The method of claim 1, further comprising adjusting one or more of power, cooling or utilization based on the thermal health value.

12. The method of claim 1, wherein at least some of the plurality of computers are different platforms, and wherein calculating a thermal health value for each of a plurality of computers includes normalizing such that each thermal health value falls within the same range of values.

13. The method of claim 12, wherein the range of values provides a mapping to computer behaviors that is uniform across different platforms.

14. The method of claim 1, further comprising aggregating the thermal health values.

15. The method of claim 14, further comprising aggregating the thermal health across one or more of a power domain, a cooling domain, a logical domain and a physical location domain.

16. The method of claim 1, further comprising, based on the calculated thermal health value of the particular computer, adjusting the performance of the particular computer.

17. The method of claim 16, wherein adjusting the performance of the particular computer comprises at least one of:
    redirecting executable instructions from the particular computer to another computer in the plurality of computers;
    reducing utilization of the particular computer; or
    reducing power to the particular computer.

18. The method of claim 1, further comprising, based on the calculated thermal health value of the particular computer, increasing a rate of removal of heat generated by the particular computer.

19. The method of claim 18, wherein increasing a rate of removal of heat generated by the particular computer comprises increasing a rate of cooling airflow over the particular computer.

20. The method of claim 1, further comprising, based on the calculated thermal health value of the particular computer, automatically generating an alarm.

21. The method of claim 1, wherein normalizing for a platform type of the particular computer comprises solving the equation:

$$THV = 1 - (T_{allowable} - T/M_{max}),$$

where THV is the normalized thermal health value of the particular computer, $T_{allowable}$ is a maximum allowable temperature of the particular computer before highest/worst behavioral changes of the particular computer, T is the measurement indicative of the temperature of the particular computer, and $M_{max}$ is a maximum allowable expected margin before highest/worst behavioral changes of the particular computer.

22. A computer program product, tangibly embodied in a machine readable storage media, comprising instructions for causing a processor to:
  receive, with a central electronic monitoring system and through a communication network, a plurality of measurements that are each indicative of a temperature of a particular computer of a plurality of computers; and
  calculate a thermal health value for each of the plurality of computers based on the measurement,
  wherein instructions to calculate the thermal health value include instructions to normalize for a platform type of the particular computer.

23. The computer program product of claim 22, wherein instructions to calculate the thermal health value include instructions to compare the measurement to stored thresholds.

24. The computer program product of claim 22, wherein the measurement comprises one or more of a temperature, a power draw of the computer, a utilization of the computer, or a rotation rate of a fan of the computer.

25. The computer program product of claim 24, further comprising instructions to receive multiple measurements of different types and wherein instructions to calculate the thermal health value include instructions to combine the multiple measurements.

26. The computer program product of claim 24, wherein the measurement comprises a temperature measurement of one or more of a central processing unit of the particular computer, a disk drive of the particular computer, a memory module of the particular computer, a motherboard of the particular computer, or air in proximity to the particular computer.

27. The computer program product of claim 22, wherein the thermal health value is a dimensionless value.

28. The computer program product of claim 27, wherein the thermal health value is a number in the range of 0 to 1.

29. The computer program product of claim 27, wherein the thermal health value is a number in the range of 0 to 10.

30. The computer program product of claim 22, further comprising instructions to select a descriptor for the thermal health value from a finite set of descriptors.

31. The computer program product of claim 22, further comprising instructions to generate an alarm if the thermal health value crosses a threshold.

32. The computer program product of claim 22, further comprising instructions to adjust one or more of power, cooling and utilization based on the thermal health value.

33. The computer program product of claim 22, wherein at least some of the plurality of computers are different platforms, and wherein the instructions to calculate a thermal health value for each of a plurality of computers includes instructions to normalize such that each thermal health value falls within the same range of values.

34. The computer program product of claim 33, wherein the range of values provide a mapping values of computer behavior that is uniform across different platforms.

35. The computer program product of claim 33, further comprising instructions to aggregate the thermal health values.

36. The computer program product of claim 35, further comprising instructions to aggregate the thermal health across one or more of a power domain, a cooling domain, a logical domain and a physical location domain.

37. The computer program product of claim 22, further comprising instructions to, based on the calculated thermal health value of the particular computer, adjust the performance of the particular computer.

38. The computer program product of claim 37, wherein the instructions to adjust the performance of the particular computer comprise instructions to perform at least one of:
  redirect executable instructions from the particular computer to another computer in the plurality of computers;
  reduce utilization of the particular computer; or
  reduce power to the particular computer.

39. The computer program product of claim 22, further comprising instructions to, based on the calculated thermal health value of the particular computer, increase a rate of removal of heat generated by the particular computer.

40. The computer program product of claim 39, wherein the instructions to increase a rate of removal of heat generated by the particular computer comprise instructions to increase a rate of cooling airflow over the particular computer.

41. The computer program product of claim 22, further comprising instructions to, based on the calculated thermal health value of the particular computer, automatically generate an alarm.

* * * * *